(12) United States Patent
Lee et al.

(10) Patent No.: US 7,527,690 B2
(45) Date of Patent: May 5, 2009

(54) FERROELECTRIC CERAMIC COMPOUND, A FERROELECTRIC CERAMIC SINGLE CRYSTAL, AND PREPARATION PROCESSES THEREOF

(75) Inventors: Sang-Goo Lee, Kyunggi-Do (KR); Min-Chan Kim, Jeju-Do (KR); Byung-Ju Choi, Incheon-Si (KR); Min-Chul Shin, Seoul (KR); Su-Han Yu, Incheon-Si (KR)

(73) Assignee: Ibule Photonics Co., Ltd. (KR)

( * ) Notice: Subject to any disclaimer, the term of this patent is extended or adjusted under 35 U.S.C. 154(b) by 159 days.

(21) Appl. No.: 10/551,355

(22) PCT Filed: Jul. 30, 2003

(86) PCT No.: PCT/KR03/01528

§ 371 (c)(1),
(2), (4) Date: Sep. 28, 2005

(87) PCT Pub. No.: WO2005/005320

PCT Pub. Date: Jan. 20, 2005

(65) Prior Publication Data

US 2006/0214131 A1 Sep. 28, 2006

(30) Foreign Application Priority Data

Jul. 11, 2003 (KR) .................. 10-2003-0047458

(51) Int. Cl.
*C30B 11/04* (2006.01)

(52) U.S. Cl. .................. 117/72; 117/3; 117/6; 117/9; 117/75

(58) Field of Classification Search .................. 117/3, 117/6, 9, 72, 75
See application file for complete search history.

(56) References Cited

U.S. PATENT DOCUMENTS 6,329,656 B1 12/2001 Whatmore ............... 250/338.2
6,468,498 B1 10/2002 Lee et al. ................... 423/619
6,491,889 B2 12/2002 Lee et al.

(Continued)

FOREIGN PATENT DOCUMENTS

JP 01-298060 A 12/1989
JP 10-0384442 5/2003

OTHER PUBLICATIONS

N. Setter, et al., Flux Growth of Lead Scandium Tantalate Pb($Sc_{0.5}$ $Ta_{0.5}$) $O_3$ and Lead Magnesium Niobate Pb ($Mg_{1/3}Nb_{2/3}$) $O_3$ Single Crystals, Journal of Crystal Growth 50 (1980) 555-556.

(Continued)

*Primary Examiner*—Robert M Kunemund
(74) *Attorney, Agent, or Firm*—Ostrolenk, Faber, Gerb & Soffen, LLP

(57) ABSTRACT

The present invention relates to a ferroelectric ceramic compound having the composition of the following formula: s[L]–x[P]y[M]z[N]p[T], a ferroelectric ceramic single crystal, and preparation processes thereof. The ferroelectric ceramic compound and the single crystal according to the present invention are relaxor ferroelectrics having high piezoelectricity, a high electromechanical coefficient and a high electrooptical coefficient, and are useful for manufacturing tunable filters for radio communication, optical communication devices, surface acoustic wave devices, and the like. Particularly, the process of preparing the single crystal according to the present invention enables preparation of a single crystal having a diameter of 5 cm or greater and a single crystal wafer with uniform composition. In the formula, [P] is lead oxide, [M] is magnesium oxide or zinc oxide, [N] is niobium oxide, [T] is titanium oxide, [L] is one selected from the group consisting of lithium tantalate or lithium niobate, lithium, lithium oxide, platinum, indium, palladium, rhodium, nickel, cobalt, iron, strontium, scandium, ruthenium, copper, yttrium, and ytterbium or mixtures thereof, and x, y, z, p and s are defined as $0.55<x<0.60$, $0.09<y<0.20$, $0.09<z<0.20$, $0.01<p<0.27$ and $0.01<s<0.1$, respectively.

7 Claims, 4 Drawing Sheets

U.S. PATENT DOCUMENTS

| | | | |
|---|---|---|---|
| 6,491,899 B1 | 12/2002 | Leinen et al. | 424/49 |
| 2002/0179000 A1* | 12/2002 | Lee et al. | 117/4 |
| 2002/0193237 A1 | 12/2002 | Messing et al. | 501/136 |

OTHER PUBLICATIONS

Shoichiro Nomura et al., Recent Applications of PMN-Based Electrostrictors, Ferroelectrics, (1983), vol. 50, pp. 197-202.

W.A. Bonner et al., Growth of Single Crystals of $P_3$ $MgNb_2$ $O_9$ By the Kyropoulos Technique, Mat. Res. Bull. vol. 2, pp. 131-134, 1967.

Sang-Good Lee, et al., Growth and electrostrive properties of $Pb(Mg_{1/3}Nb_{2/3})O_3$ Crystals, Applied Physics Letters, vol. 74, No. 7, pp. 1030-1032.

Wei-Gen Luo, et al., High-Field Properties of PMN-PT Single Crystals, 1999 IEEE Ultrasonics Symposium, pp. 1009-1012.

International Search Report PCT/KR2003/001528 dated Apr. 13, 2004.

* cited by examiner

FERROELECTRIC CERAMIC COMPOUND, A FERROELECTRIC CERAMIC SINGLE CRYSTAL, AND PREPARATION PROCESSES THEREOF

CROSS REFERENCE TO RELATED APPLICATIONS

The present application is a 35 U.S.C. §371 national phase conversion of International Application No. PCT/KR2003/001528 filed Jul. 30, 2003, which claims priority from Korean patent application No. 10-2003-0047458 filed Jul. 11, 2003, incorporated herein by reference.

TECHNICAL FIELD

The present invention relates to a ferroelectric ceramic compound, a ferroelectric ceramic single crystal, and preparation processes thereof. More particularly, the present invention relates to a widely applicable ferroelectric ceramic compound having superior ferroelectric, piezoelectric, electromechanical, electrooptical, and electrostrictive properties, a single crystal having a diameter of 5 cm or greater prepared therefrom, and preparation processes thereof.

BACKGROUND ART

A single crystal means a homogeneous material having one regular arrangement without any boundaries, contrary to materials in which general ceramic components exist in the form of powder and particles thereof disorderly exist in a state where the particles have boundaries. Due to such a regular physical state, the single crystal provides physical, electromechanical, optical and electrooptical properties completely different from those of general ceramics and thus is used for preparation of a variety of latest devices such as tunable filters for radio communication, surface acoustic wave (SAW) devices or film bulk acoustic resonator (FBAR) devices, optical modulators, medical and military ultrasonic transducers, nonvolatile memory devices, actuators for fine displacement control, small batteries, radiant energy receivers, and the like.

Particularly, a single crystal having the properties of intelligent relaxor ferroelectrics among such single crystals can be used as a sensor due to its intelligence, can be micro-machined due to its most dense, regular arrangement of atoms and molecules in a given space, and can exhibit superior piezoelectric, electromechanical and electrooptical properties due to the absence of a grain boundary. The term "relaxor" means the property of relaxing temperature dependency by which physical property values are affected by outside temperature, which is a critical problem that most electrical parts or devices, materials, equipment and the like have.

Due to such superior properties, the intelligent relaxor ferroelectric single crystal can be used for ultrasonic transducers, actuators, microphones, tunable filters for wire/wireless communications, SAW devices, FBAR and the like by using its piezoelectric property by which a voltage is generated upon application of stress to the single crystal and its electrostrictive property by which striction is generated upon application of a voltage thereto the other way around. Further, due to its excellent electrooptical property, the single crystal is a promising material for optical modulators, optical switches and the like that are functional devices for optical communication. Moreover, even in a nonvolatile memory field on which much interest has been focused recently in a memory field, the single crystal can be used to prepare superior memory devices due to its excellent ferroelectric property.

However, the single crystal that has superior properties and is expected to be applied to various latest devices as described above is generally very difficult to grow to a commercially applicable single crystal having a diameter of 5 cm (2 inches) or greater. Thus, the single crystal has not yet been commercialized heretofore. Even though such a single crystal is obtained, the quality of the single crystal is closely related to a method by which a ceramic material of the single crystal is prepared, and the composition of the ceramic material. Research reports that have been conducted heretofore are as follows.

G. A. Smolenskii and A. I. Agranovskaya first reported lead magnesium niobate ($Pb(Mg_{1/3}Nb_{2/3})O_3$; "PMN"), which is one of new relaxor ferroelectric ceramics, in *Sov. Phys. Solid State* Vol. 1, 1429 (1959). Since such a ceramic was first reported, W. A. Bonner and L. G. Van Uitert reported that they succeeded in growing a PMN single crystal to a size of a several mm to 2 cm using the Kyropoulos method, in *Mater Res. Bull.* Vol. 2, 131 (1967). In 1980, N. Setter and L. E. Cross reported that they succeeded in growing a PMN single crystal to a size of 1 cm using a flux method, in *J. Cryst. Growth*, Vol. 50, p 555 (1980). In 1983, S. Nomura and K. Uchino reported various properties of such a PMN single crystal and the properties of a PMN-PT single crystal that is a PT compound of the PMN single crystal in *Ferroelectrics Vol.* 50, p 107-203 (1983). They reported that the single crystal was excellent in piezoelectric, electromechanical, ferroelectric and pyroelectric properties.

Even thereafter, many research results have been reported. Recently, Sang-goo Lee et al. first succeeded in growing PMN to a size of about 1 cm using the Bridgemann method and reported its superior physical properties (see *Appl. Phys. Letts.* Vol. 74, No. 7, 1030 (1999)). Further, Luo et al. reported the growth and the properties of a PMN-PT single crystal having a diameter of 2.5 cm using a supplemented Bridgemann method in 1999 IEEE Ultrasonic Symposium-1009.

However, as can be seen from the aforementioned, conventional PMN-PT compositions and processes of preparing the single crystals using the compositions, there have been reported and researched only processes of preparing single crystals having a diameter of about 2.5 cm that can be used only for researches or experiments. Such a size is much short of a diameter of 5 cm that is a minimum wafer size for use in a current device fabricating process. Therefore, the development of a device using such a single crystal has not been made. Even though the flux-growth method, which is a method exhibiting most excellent reproducibility among methods of preparing single crystals that have been reported heretofore, is employed, a single crystal having an irregular size is obtained. Thus, there is a disadvantage in that the method cannot be used for commercial mass production.

The major reason that such a relaxor ferroelectric single crystal has not yet been applied to commercial devices though studies on the relaxor ferroelectric single crystal have been continuously conducted for last 40 years is that it is impossible to stably produce a large single crystal having a diameter of about 5 cm by using the existing single crystal growth method, in view of the properties of the ferroelectric material containing a great deal of lead component.

Meanwhile, methods for solving the problem are disclosed in Korean Patent No. 0384442 and U.S. Pat. Nos. 6,491,899 and 6,468,498 in the name of and assigned to Ibule Photonics Co., Ltd., respectively. However, the methods also have problems in that composition uniformity is deteriorated in a single crystal due to a low phase-transition temperature, and its application range is relatively narrow.

DISCLOSURE OF INVENTION

Accordingly, the present invention is conceived to solve the aforementioned problems, i.e. to overcome a limitation on commercialization resulting from limitations on electromagnetic, optical and electrooptical properties, problems of crystal size and uniformity, and problems of physical properties such as a low phase transition temperature, which conventional compounds that have been reported heretofore have. An object of the present invention is to prepare an intelligent relaxor ferroelectric single crystal having a diameter of 5 cm or greater suitable for commercialization and having a novel composition with property values suitable for fabrication of devices such as the latest tunable filters for radio communication, ultrasonic transducers, very high speed modulators for optical communication, actuators for micro-displacement control and nonvolatile memory devices.

Particularly, an object of the present invention is to provide a process of preparing a ceramic composition having superior electrical and physical properties and a homogeneous single crystal using the same, which comprises a high-temperature calcination step that is called an [L] reaction step, and an additive addition step if the control of properties including a temperature property is required in the reaction step, in order to improve uniformity of the composition of components and expand a use range thereof.

According to the present invention for accomplishing the objects, there are provided a ceramic compound having the composition of the following formula 1 and a ferroelectric ceramic single crystal using the compound:

$$s[L]\text{-}x[P]y[M]z[N]p[T] \quad (1)$$

where, [P] is lead oxide ($PbO$, $PbO_2$, $Pb_3O_4$),

[M] is magnesium oxide (MgO),

[N] is niobium oxide ($Nb_2O_5$),

[T] is titanium dioxide ($TiO_2$),

[L] is a metal selected from the group consisting of lithium tantalate ($LiTaO_3$), lithium niobate ($LiNbO_3$), lithium (Li) or lithium carbonate ($Li_2CO_3$), platinum (Pt), gold (Au), silver (Ag), palladium (Pd), rhodium (Rh), indium (In), nickel (Ni), cobalt (Co), iron (Fe), strontium (Sr), scandium (Sc), ruthenium (Ru), copper (Cu), yttrium (Y) and ytterbium (Yb), or oxides thereof, and x is defined as 0.55<x<0.60, y is defined as 0.09<y<0.20, z is defined as 0.09<z<0.20, p is defined as 0.01<p<0.27, and s is defined as 0.01<s<0.1.

Further, a process of preparing a single crystal using an intelligent relaxor ferroelectric ceramic compound having the composition of formula 1 according to the present invention comprise a ceramic precursor reaction step ("[L] reaction step"), a ceramic compound reaction step, and a crystallization step.

The ceramic precursor reaction step is the step of mixing 0.09 to 0.20 mol, 0.09 to 0.20 mol and 0.01 to 0.27 mol of magnesium oxide (MgO) or zinc oxide (ZnO), niobium oxide ($Nb_2O_5$), and titanium dioxide ($TiO_2$), respectively, with one another, adding one or more metals selected from the group consisting of lithium tantalate ($LiTaO_3$), lithium niobate ($LiNbO_3$), lithium (Li) or lithium carbonate ($Li_2CO_3$), platinum (Pt), gold (Au), silver (Ag), palladium (Pd), rhodium (Rh), indium (In), nickel (Ni), cobalt (Co), iron (Fe), strontium (Sr), scandium (Sc), ruthenium (Ru), copper (Cu), yttrium (Y) and ytterbium (Yb), or oxides thereof as additives for facilitating a reaction or controlling properties, and causing them to react with one another at a high temperature of 1,100 to 2,000° C.

The ceramic compound reaction step is the step of mixing 0.55 to 0.65 mol of lead oxide with a formula of $Pb_xO_y$ such as $PbO$, $PbO_2$ or $Pb_3O_4$ with the compound obtained through the above reaction in such a manner that the lead oxide is pulverized and then mixed in a dry state or using a dispersion medium of an organic solvent and then mixed, drying the mixture, calcining the dried mixture at a temperature of 800 to 1,000° C., and pulverizing the resultant mixture into powder.

The crystallization step is the step of charging the powder obtained in the above step into a crucible resistant to high temperature and pressure, closing the crucible, melting the powder in a crystal growth furnace, and slowly cooling the melt to be crystallized.

Further, in a case where one or more metals selected from the group consisting of lithium tantalate ($LiTaO_3$), lithium niobate ($LiNbO_3$), lithium (Li) or lithium carbonate ($Li_2CO_3$), platinum (Pt), gold (Au), silver (Ag), palladium (Pd), rhodium (Rh), indium (In), nickel (Ni), cobalt (Co), iron (Fe), strontium (Sr), scandium (Sc), ruthenium (Ru), copper (Cu), yttrium (Y) and ytterbium (Yb), or oxides thereof as additives belonging to the [L] group for facilitating a reaction or controlling properties are added in the ceramic precursor reaction step ([L] reaction step), it is preferred that the amount of use range from 0.01 to 0.1 mol with respect to 1 mol of finished PMNT.

A ferroelectric single crystal of the present invention is prepared through the first solid phase reaction step at a high temperature that is called the [L] reaction step as the precursor reaction step, the second solid phase reaction step that is a complete ceramic composition reaction step, and the melting-crystallization step of the resultant ceramic compound. The single crystal prepared in such a manner is a novel, homogeneous material. The single crystal has an electromechanical coupling coefficient and piezoelectricity higher than those of single crystals that have been reported heretofore, light transmittance of 60% or greater, a high electrooptical coefficient, and high composition uniformity in a mass of the single crystal or respective regions of a wafer. Thus, the single crystal of the present invention can be usefully employed in ultrasonic transducers, devices for radio communication, optical modulators that are functional devices for optical communication, nonvolatile memory devices and actuators for micro-displacement control.

Specifically, in the process of preparing ceramic compound powder having a new composition according to the present invention, for the first [L] reaction step (ceramic precursor reaction step) that is one of kernels of the present invention, one of magnesium oxide and zinc oxide selected from the [M] group, niobium oxide of the [N] group and titanium dioxide of the [T] group as raw materials are mixed at the proper mole ratio described above and then react with one another at a high temperature of 1,100 to 2,000° C. Further, to facilitate the reaction or control properties in this reaction step, it is possible to add one or more metals selected from the group consisting of lead titanate ($PbTiO_3$), lithium tantalate ($LiTaO_3$) or lithium niobate ($LiNbO_3$), lithium (Li) or lithium carbonate ($Li_2CO_3$), platinum (Pt), gold (Au), silver (Ag), palladium (Pd), rhodium (Rh), indium (In), nickel (Ni), cobalt (Co), iron (Fe), strontium (Sr), scandium (Sc), ruthenium (Ru), copper (Cu), yttrium (Y) and ytterbium (Yb), or oxides thereof as additives belonging to the [L] group. The amount of use ranges from 0.01 to 0.1 mol with respect to 1 mol of PMNT.

Then, the resultant mixture is pulverized using the dispersion medium of the organic solvent or in a dry state and then mixed. Thereafter, the mixture is dried and calcined. Ethyl alcohol, isopropyl alcohol or the like can be used as the organic solvent. The drying may be performed by means of a conventional method, for example, using a dryer at a temperature of 150 to 200° C. The calcination may be performed, for example, for 1 to 10 hours at a temperature of 1,100 to 2,000° C.

One of lead oxides ($Pb_xO_y$) belonging to the [P] group is selected and mixed with the mixture obtained above. Then, the resultant mixture is pulverized, mixed, dried and calcined by means of the aforementioned process. Here, the calcination for the second reaction may be performed, for example, for 1 to 10 hours at a temperature of 800 to 1,000° C. The ceramic powder having the novel composition obtained in the above way is a novel ferroelectric ceramic compound having superior temperature property and high composition uniformity.

To prepare a single crystal, which is more homogeneous, has superior properties and is applicable variously, using the novel, superior ferroelectric ceramic compound, the melting-crystallization step is finally performed.

In the melting-crystallization step, the ceramic compound that has been subjected to the [L] reaction and the second solid phase reaction is melt in a platinum crucible, a platinum-rhodium alloy crucible, an iridium crucible, a zirconium crucible or a ceramic crucible, which has a diameter of 5 cm or greater as shown in FIG. 2, under high temperature and pressure, and the melt is then slowly cooled to be crystallized. The melting is performed in a closed crucible under a high temperature of 1,200 to 1,500° C. and a high pressure of 10 to 1,000 psi. Then, the melt is maintained at the high temperature for 360 to 500 hours and slowly cooled to room temperature for about 80 to 100 hours. With this step, the material is formed to be homogeneous in the level of atoms or molecules and a lattice structure. Therefore, it is possible to obtain a single crystal having a homogeneous composition that exhibits physical and chemical properties completely different from those of the ceramic compound obtained after the ceramic composition reaction step. Further, since the diameter of the crucible can be freely increased, it is possible to prepare a circular single crystal having as large a diameter as required. Generally, the diameter of the single crystal can be increased to 30 cm. However, in the case where the diameter of the single crystal is increased, it is preferred that the crucible be rotated or provided with a particular cooling device to improve the uniformity of inside temperature and its composition.

Meanwhile, typical ferroelectric materials include barium strontium titanate (BST), strontium titanate (STO) and the like. However, they are prepared in the form of a film due to difficulty in preparing them in the form of a single crystal. There are advantages in that these materials have low dielectric loss and high non-linearity of permittivity even at a high frequency (several tens GHz). However, there are disadvantages in that material properties greatly vary according to preparation processes of a film and a high electric field should be applied to obtain a sufficient rate of change in capacitance. If the materials are prepared in the form of the single crystal in accordance with the present invention, there are advantages in that the properties are stably maintained, it is possible to obtain high permittivity higher than that of BST, and a high rate of change in capacitance is obtained even in a low electric field.

BRIEF DESCRIPTION OF DRAWINGS

The above and other objects and features of the present invention will become apparent from the following description of an example given in conjunction with the accompanying drawings, in which.

BEST MODE FOR CARRYING OUT THE INVENTION

Hereinafter, an example of the present invention will be described in detail with reference to the accompanying drawings. However, it should be understood that the example does not limit the present invention.

Example

Ferroelectric Ceramic Compound and Preparation of a Single Crystal Thereof

Raw materials in the [L] reaction step listed in Table 1 below, which shows components of a ferroelectric single crystal of the present invention, were measured and mixed. The mixture was pulverized and mixed using ethanol as a dispersion medium in a 0.5" zirconia ball mill. Then, the resultant mixture was dried in an electric furnace controlled at the temperature of 150° C. The dried mixture was calcined in a capped alumina crucible with a lid at the temperature of 1,600° C. for 6 hours to complete the first reaction. The calcined material obtained this way was uniformly pulverized again by using the ball mill. The first resultant reactants obtained in the above way was subjected to the [P] composition step and then calcined in the capped alumina crucible at the temperature of 920° C. for 4 hours to complete the second reaction.

Figure 1A:
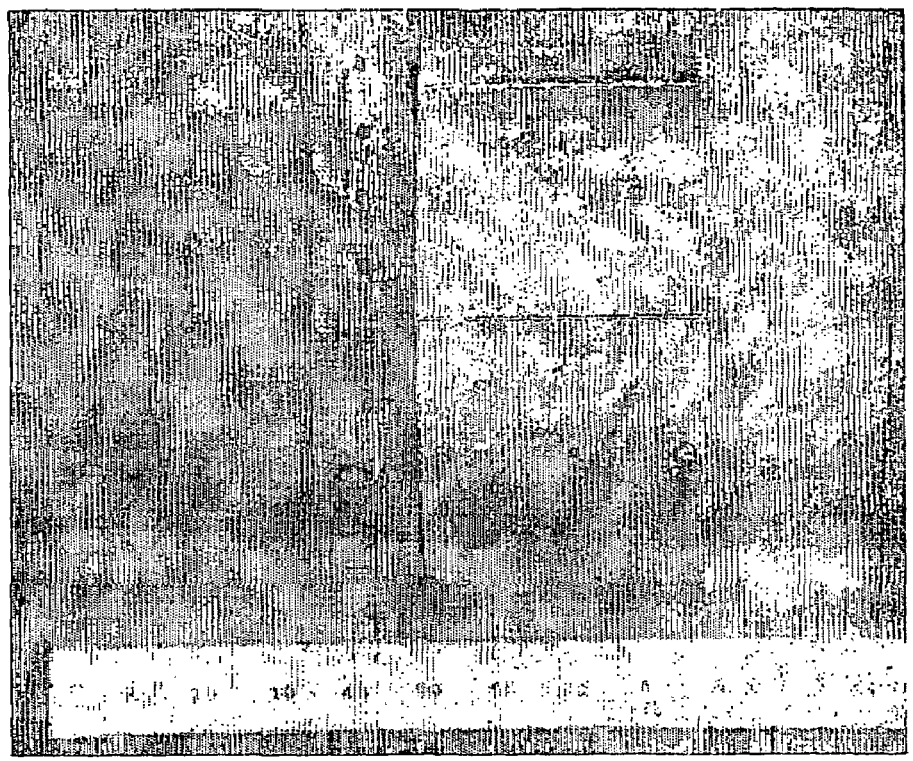
FIG. 1a is a photograph of a single crystal ingot for use in preparing a single crystal according to the present invention.
Figure 1B:
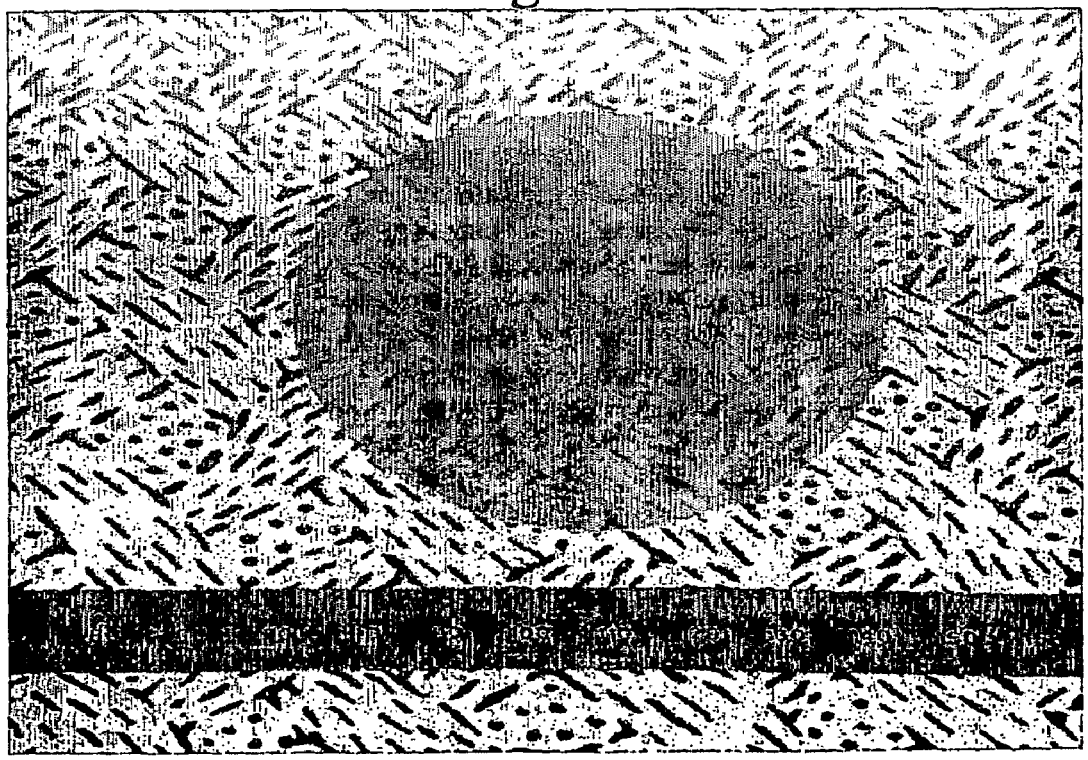
FIG. 1b is a photograph showing a state where the single crystal of the present invention is polished in the form of a wafer.
Figure 1C:
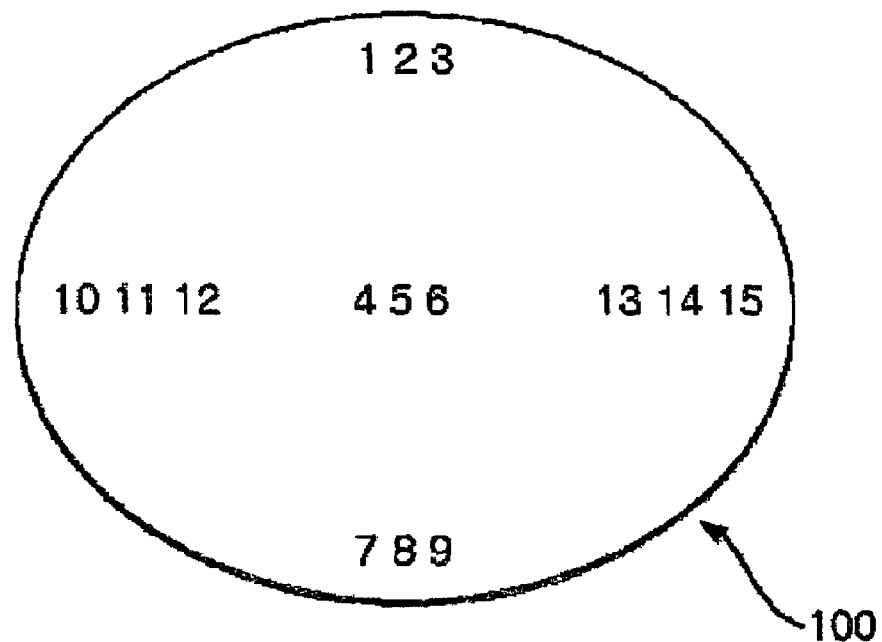
FIG. 1c is a view showing an external appearance of a ceramic compound single crystal polished in the form of a wafer according to the present invention.
Figure 1D:
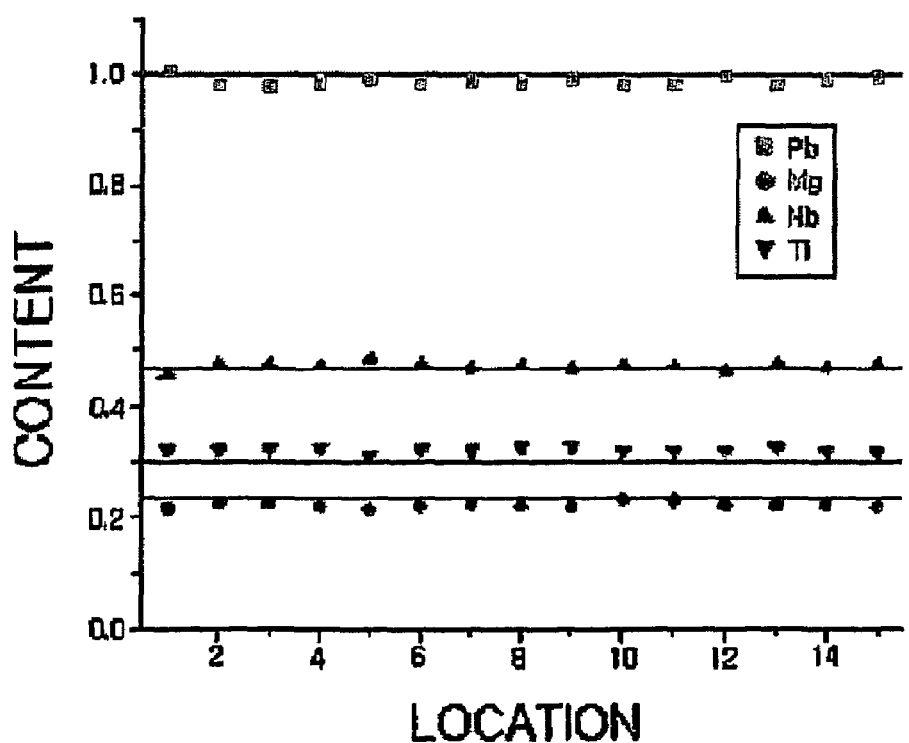
FIG. 1d is a graph showing the uniformity of components depending on positions in the single crystal of FIG. 1c.
Figure 2:
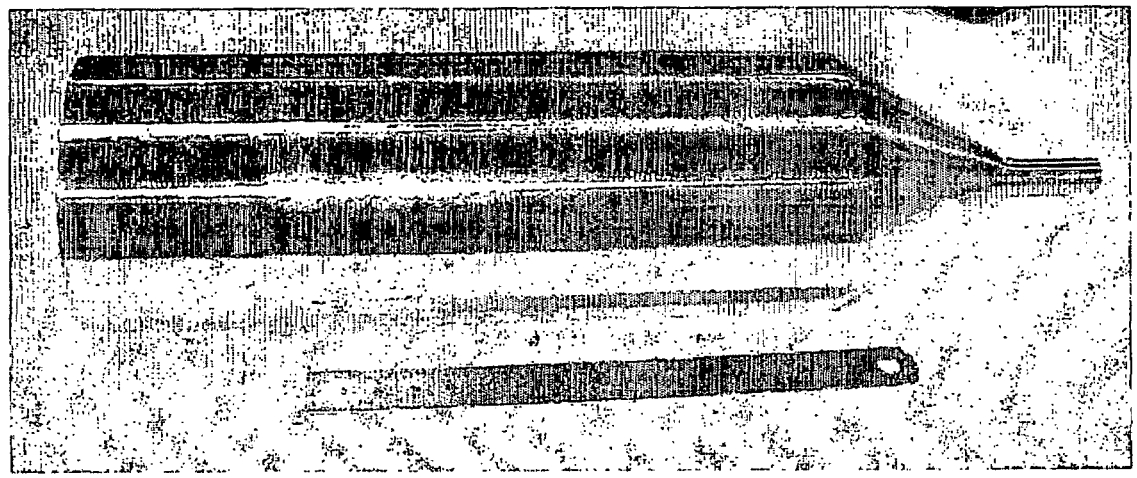
FIG. 2 is a photograph showing an external appearance of a crucible for use in preparing the single crystal according to the present invention.

The obtained ceramic powder was charged into a platinum crucible that in turn was closed, and then was completely melted by being placed in a high-temperature crystal growth furnace (1,500° C., 100 psi) for 20 hours. The melt was maintained at the temperature of 1,500° C. for 360 hours and then slowly cooled to the temperature of 20° C. to obtain a transparent and homogeneous crystal. The crystal was then polished to obtain a wafer shown in FIG. 1b. The uniformity of components depending on 5 positions in the wafer of FIG. 1c is plotted in a graph of FIG. 1d.

TABLE 1

Components of the ferroelectric single crystal of the present invention

| | | | | | [L] reaction step (First step reaction) | |
|---|---|---|---|---|---|---|
| | x[P]<br>0.55 < x < 0.65<br>x: mol<br>x + y + z + p = 1 | y[M]<br>0.12 < y < 0.20<br>y: mol | z[N]<br>0.12 < z < 0.20<br>z: mol | p[T]<br>0.01 < p < 0.20<br>p: mol | s[L]<br>0.01 < s < 0.1<br>n: mol/mol =<br>s/(x + y + z + p) | Formula |
| Raw materials | [P]:<br>Pb$_2$O$_3$<br>or<br>PbO | [M]:<br>MgO<br>or<br>ZnO | [C]:<br>Nb$_2$O$_5$ | [P]:<br>TiO$_2$ | [N]:<br>NiO<br>LiTaO$_3$<br>LiNbO$_3$<br>Li$_2$CO$_3$<br>Pt<br>Ag<br>Au<br>Pd<br>Rh, InO<br>Co<br>Fe$_2$O$_3$<br>ScO<br>SrO<br>RuO$_2$<br>CuO<br>YbO, Yb$_2$CO$_3$ | s[L]-<br>x[P]y[M]z[N]p[T] |
| Example 1 | PbO<br>0.564 mol | MgO<br>0.127 mol | 0.127 mol | 0.180 mol | 0.01 mol % Pt + 0.03 Li$_2$CO$_3$ | L-PMNT |
| 2 | PbO<br>0.564 mol | MgO<br>0.127 mol | 0.127 mol | 0.180 mol | 0.01 mol % Pt + 0.03 InO | I-PMNT |
| 3 | PbO<br>0.564 mol | MgO<br>0.127 mol | 0.127 mol | 0.180 mol | 0.01 mol % Pt + 0.03 Y | Y-PMNT |
| 4 | PbO<br>0.564 mol | MgO<br>0.127 mol | 0.127 mol | 0.180 mol | 0.01 mol % Pt + 0.03 Yb | Yb-PMNT |

L-PMNT: 0.01[Pt]0.03[Li$_2$CO$_3$] – 0.56[PbO]0.13[PbTiO$_3$]0.13[PbTiO$_3$]0.18[PbTiO$_3$]
I-PMNT: 0.01[Pt]0.03[InO] – 0.56[PbO]0.13[PbTiO$_3$]0.13[PbTiO$_3$]0.18[PbTiO$_3$]
Y-PMNT: 0.01[Pt]0.03[YbO] – 0.56[PbO]0.13[PbTiO$_3$]0.13[PbTiO$_3$]0.18[PbTiO$_3$]
Yb-PMNT: 0.01[Pt]0.03[Yb2CO3] – 0.56[PbO]0.13[PbTiO$_3$]0.13[PbTiO$_3$]0.18[PbTiO$_3$]

Experiment 1

Test of Electromechanical and Piezoelectric Performance for Manufacturing a Medical Ultrasonic Diagnosis Apparatus To measure properties necessary for fabrication of a transducer for an ultrasonic diagnosis apparatus using the single crystal obtained in the example, both sides of the single crystal was polished to have a thickness of 0.5 mm and then cleaned using a ultrasonic cleaner. Thereafter, chrome electrodes of 15 mm×5 mm were formed on the both sides by using a DC magnetron sputter (Model KVSC T5050, a product of Korea Vacuum Science).

The dielectric constant and dielectric loss of the single crystal were calculated based on capacitance and dissipation measured at 1 kHz and 0.5 Vrms using HP 4192A LF impedance analyzer (available from Hewlett-Packard Co.). Further, as for the piezoelectric property, an electric field of 4 kV/cm was applied to the single crystal at 120° C. for 30 minutes for crystal polarizing. Thereafter, the electromechanical coupling coefficient $k_{33}$ and the piezoelectric constant $d_{33}$ in a polarization direction vibration mode were calculated by a resonance or semi-resonance method. The electromechanical coupling coefficient $k_{33}$ means an efficiency of converting electric energy into mechanical energy when an electric field is applied to piezoelectrics. The piezoelectric constant $d_{33}$ in the polarization direction vibration mode is a measure of a charge amount $D_3$ generated in an axial direction when a given compressive or tensile stress is applied in the axial direction.

The dielectric constants, loss piezoelectric constants and electromechanical coupling coefficients of the single crystal of the present invention and conventional materials are shown in Table 2 below to compare them with each other.

TABLE 2

| | PZT-5A | PZT-5H | PMN-PT single crystal | PZN-PT single crystal | L-PMNT single crystal (Example 1) |
|---|---|---|---|---|---|
| Dielectric constant | 1700 | 3400 | 5500 | 5000 | 7000 |
| Loss piezoelectric constant | 0.02 | 0.02 | 0.006 | 0.014 | 0.005 |
| $d_{33}$(pC/N) | 374 | 593 | 2200 | 2000 | 2500 |
| $d_{31}$(pC/N) | 200 | | | | 1000 |
| $d_{15}$(pC/N) | 300 | | | | 7000 |
| $k_{33}$ | 0.705 | 0.75 | 0.92 | 0.91 | 0.95 |
| Phase transition temperature | | | 145° C. | 150° C. | 190° C. |

As shown in Table 2, according to the present invention, it is possible to prepare a ferroelectric ceramic single crystal having a dielectric coefficient of 6,000 to 15,000 at room temperature.

Experiment 2

Fabrication and Test of a Variable Capacitor for Use in Manufacturing Tunable Filters for Radio Communication Two types of coplanar capacitor and interdigital capacitor (IDC) were used. An IDC structure formed on a single crystal substrate of the present invention shown in FIG. 3 has an advantage in that its capacitance can be increased if a strong electric field is applied thereto by reducing the spacing between electrodes. However, the IDC structure has a disadvantage in that it is modeled as a complex equivalent circuit. A surface of a substrate using the piezoelectric single crystal prepared in the example was subjected to ultrasonic cleaning at 40° C. for 20 minutes in a solution comprising 5% of DECONEX and 95% of deionized water that is widely used for removing organics, rinsed and cleaned again by a conventional semiconductor surface cleaning process.

On the cleaned surface of the single crystal, an aluminum alloy (Al-0.5% Cu) was deposited at a thickness of about 1,000 Å or greater by a sputtering method to fabricate a capacitor. To implement electrodes with accurate dimensions designed, a lift-off etching method was used. The thickness of Au electrodes put to use was determined as a thickness for causing the amplitude of a penetrating electromagnetic wave to be decreased to 2% or less. To cause the Au electrodes to have good adhesiveness to the substrate, a Ti metal film was precoated on the substrate. The electrodes were formed by performing patterning on the piezoelectric single crystal substrate by a semiconductor process. That is, a photoresist was spin-coated on the aluminum alloy film at a thickness of about 1 μm. Then, the photoresist was covered with a photomask, exposed to ultraviolet (UV) rays and then developed, so that photoresist patterns corresponding to those of the photomask can be formed on the aluminum alloy film. A portion of the aluminum alloy film that was not covered with the photoresist was removed by means of a wet etching method using an aluminum etching solution with phosphoric acid, nitric acid, acetic acid and distilled water mixed therein, so that patterns of aluminum alloy film can be formed. Then, the photoresist was finally removed using a photoresist removing solution (PR remover) to fabricate the capacitor of the present invention.

Figure 3:
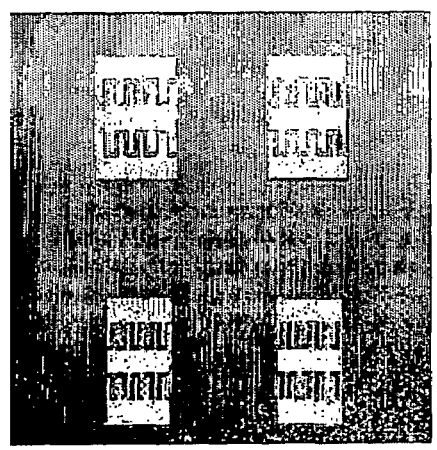
FIG. 3 is a photograph showing patterns of tunable filters fabricated using the single crystal according to the present invention.
Figure 4:
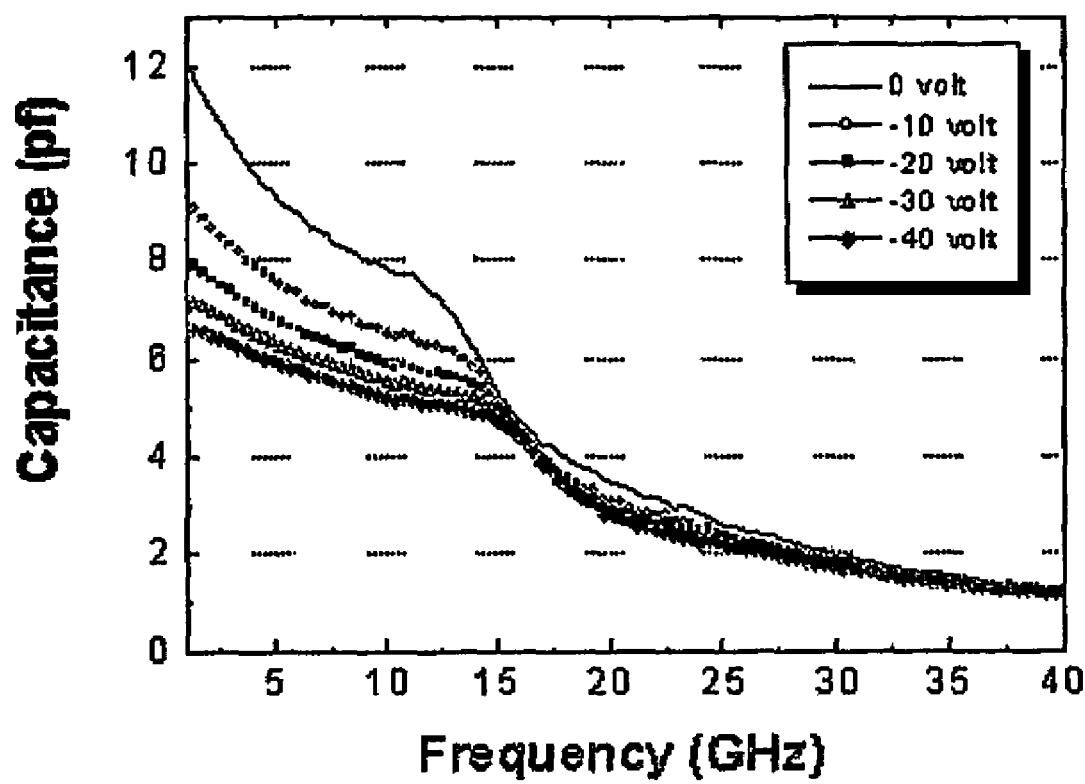
FIG. 4 is a graph showing a frequency response of a tunable filter fabricated using the single crystal according to the present invention.

FIG. 3 is a photograph showing the patterns of the capacitor using the piezoelectric single crystal according to the example of the present invention. Changes in capacitance were measured by applying electric fields at frequencies up to 40 GHz to the capacitor fabricated according to the present invention as shown in FIG. 3. The changes in capacitance with frequencies are shown in FIG. 4. The applied electric fields ranged from −40 volts to 0 volts. A ratio of change in capacitance (tunability) of IDC fabricated according to the present invention was measured up to maximum 40%. However, when a variable capacitor was fabricated in the form of a thick or thin film using the material of the present invention and a structure for applying an electric field to above and below the film was employed, higher tunability could be obtained even with a low voltage applied there to.

Experiment 3

Test of Electrooptical Performance for Fabrication of an Optical Modulator

It was found that the single crystal prepared in the example could be employed for a substrate for use in fabricating an optical modulator by confirming the phenomenon that optical properties varied when an external electric field was applied to the single crystal (i.e., by obtaining a first order electrooptical coefficient; Test method: Fernando Agullo-Lopez, Jose Manuel Cabrera, Fernando Agullo-Rueda, Electooptics, pp 49, Academic Press, 1994).

It was found that although there was a slight variation according to the composition of the substrate, the substrate of the present invention had an electrooptical coefficient of about 50 to 500 pm/V which is ten times as large as a 30 to 50 pm/V of conventional materials such as lithium niobate (LN) or lithium tantalate (LT).

Experiment 4

Displacement Test for Control of a Micro Actuator

The values of $d_{33}$, $d_{31}$ and $d_{15}$ of the single crystal prepared according to the present invention were 2,000 to 4,000 pm/V, −1,200 to −600 pm/V and 5,000 to 8,000 pm/V, respectively. Therefore, the displacement that was ten times as large as that of a conventional PZT material was obtained.

Experiment 5

Film Fabrication Test for a Nonvolatile Memory Device

To fabricate a nonvolatile memory device by using, as a target, the single crystal or ceramic compound prepared according to the present invention, upon formation of a single crystal ferroelectric film on a silicon substrate or a ferroelectric single crystal substrate, the single crystal film was formed by placing a lower electrode on the silicon substrate or the ferroelectric single crystal substrate with an offset axis by means of a conventional method, and depositing a ferroelectric single crystal on the lower electrode by means of a pulsed laser deposition (PLD) method or metalorganic chemical vapor deposition (MOCVD) method. After 10V was applied to a region of 10 μm×10 μm of the obtained film and then fallen down, −10 V was applied to a region of 5 μm×5 μm within the above region and then fallen down. Thereafter, a region of 15 μm×5 μm was scanned, and the results that a difference in contrast between the regions to which −10 V and 10 V were applied and then fallen down was 5 V or greater could be obtained. Therefore, it was found that a superior nonvolatile memory device could be fabricated according to the material and process of the present invention.

Although the present invention has been described in connection with the example of the present invention illustrated in the drawings, it is not limited to the constitution and effects described above and illustrated in the drawings. It will be understood by those skilled in the art that various modifications and changes can be made thereto without departing from the spirit and scope of the invention defined by the appended claims. Therefore, such modifications and changes and equivalents should be construed as falling within the scope of the invention.

INDUSTRIAL APPLICABILITY

The novel intelligent ferroelectric single crystal prepared according to the present invention has a high electromechanical coupling coefficient and piezoelectricity, and light transmittance of 60% or greater. The composition of wafers obtained from a single mass of a single crystal is remarkably homogeneous. Particularly, the intelligent ferroelectric single crystal exhibits a superior property by which the phase transition temperature determining the range of application is increased by 25% or greater over that of conventional material, and has a high electrooptical coefficient. Thus, the single crystal of the present invention can be usefully employed in ultrasonic generators, devices for radio communication, functional devices for optical communication, actuators for micro-displacement control, piezoelectric pumps, and non-volatile memory devices.

Meanwhile, when a material is prepared in the form of a single crystal according to the present invention, there are advantages in that its properties can be stably maintained, permittivity higher than that of conventional BST can be obtained, and high tunability can be obtained even in a weak electric field.

The invention claimed is:

1. A process of preparing a single crystal, comprising:
   a first step of mixing 0.09 to 0.20 mol, 0.09 to 0.20 mol and 0.01 to 0.27 mol of magnesium oxide (MgO) or zinc oxide (ZnO), niobium oxide ($Nb_2O_5$), and titanium dioxide ($TiO_2$), respectively, with one another;
   a second step of adding additives to facilitate a reaction of the mixture obtained in the first step or control the properties of the mixture and causing the resultant mixture to react at a high temperature;
   a third step of mixing the compound obtained in the second step with one selected from lead oxides having a formula of $Pb_xO_y$, in an amount of 0.55 to 0.65 mol, drying and calcining the resultant mixture, and pulverizing the calcined product into powder; and
   a fourth step of melting the powder obtained in the third step under high temperature and pressure and slowly cooling the melt to be crystallized.

2. The process as claimed in claim 1, wherein the additives added in the second step comprise one or more metals selected from the group consisting of lithium tantalate ($LiTaO_3$), lithium niobate ($LiNbO_3$), lithium carbonate ($Li_2CO_3$), platinum (Pt), gold (Au), silver (Ag), palladium (Pd), rhodium (Rh), indium (In), nickel (Ni), cobalt (Co), iron (Fe), strontium (Sr), scandium (Sc), ruthenium (Ru), copper (Cu), yttrium (Y) and ytterbium (Yb), or oxides thereof.

3. The process as claimed in claim 1, wherein causing the resultant mixture to react at a high temperature in the second step is performed at a temperature of 1,100 to 2,000.

4. The process as claimed in claim 1, wherein the mixing in the third step is performed through pulverization and mixing in a dry state or using a dispersion medium of an organic solvent.

5. The process as claimed in claim 1, wherein the calcination in the third step is performed at a temperature of 800 to 1,000.

6. The process as claimed in claim 1, wherein the melting under high temperature and pressure in the fourth step is performed by charging the powder obtained in the third step into a crucible under high temperature and pressure, closing the crucible, and melting the powder.

7. The process as claimed in claim 1, wherein the fourth step is performed by charging the powder obtained in the third step into a crucible under high temperature and pressure, closing the crucible, melting the powder at a temperature of 1,200 to 1,500 and a pressure of 20 to 1,000 psi, maintaining the melt at the temperature for 360 to 500 hours, and slowly cooling the melt to room temperature.

* * * * *